(12) United States Patent
Kaplenko et al.

(10) Patent No.: US 11,815,479 B2
(45) Date of Patent: Nov. 14, 2023

(54) METHOD OF EXAMINING A SAMPLE USING A CHARGED PARTICLE BEAM APPARATUS

(71) Applicant: FEI Company, Hillsboro, OR (US)

(72) Inventors: Oleksii Kaplenko, Brno (CZ); Ondřej Machek, Brno (CZ); Tomáš Vystavěl, Brno (CZ); Jan Klusáček, Brno (CZ); Kristýna Bukvišová, Brno (CZ); Mykola Kaplenko, Brno (CZ)

(73) Assignee: FEI Company, Hillsboro, OR (US)

( * ) Notice: Subject to any disclaimer, the term of this patent is extended or adjusted under 35 U.S.C. 154(b) by 137 days.

(21) Appl. No.: 17/462,933

(22) Filed: Aug. 31, 2021

(65) Prior Publication Data
US 2022/0065804 A1 Mar. 3, 2022

(30) Foreign Application Priority Data
Aug. 31, 2020 (EP) ..................... 20193594

(51) Int. Cl.
*G01N 23/2206* (2018.01)
*G01N 23/203* (2006.01)
*G01N 23/2204* (2018.01)

(52) U.S. Cl.
CPC ....... *G01N 23/2206* (2013.01); *G01N 23/203* (2013.01); *G01N 23/2204* (2013.01);
(Continued)

(58) Field of Classification Search
CPC ............. G01N 23/2206; G01N 23/203; G01N 2223/053; G01N 2223/07; G01N 2223/40;
(Continued)

(56) References Cited

U.S. PATENT DOCUMENTS 5,218,529 A * 6/1993 Meyer ..................... G06N 3/02
706/924
8,108,328 B2 * 1/2012 Hench ................ G03F 7/70625
706/16
(Continued)

OTHER PUBLICATIONS

Ying Gu, Automated Scanning Electron Microscope Based Mineral Liberation Analysis An Introduction to Mineral Liberation Analyser, Journal of Minerals & Materials Characterization & Engineering, vol. 2, No. 1, Jan. 1, 2003, pp. 33-41.
(Continued)

*Primary Examiner* — David A Vanore (57) ABSTRACT

The invention relates to a method of, and apparatus for, examining a sample using a charged particle beam apparatus. The method as defined herein comprises the step of detecting, using a first detector, emissions of a first type from the sample in response to the charged particle beam illuminating the sample. The method further comprises the step of acquiring spectral information on emissions of a second type from the sample in response to the charged particle beam illuminating the sample. As defined herein, said step of acquiring spectral information comprises the steps of providing a spectral information prediction algorithm and using said algorithm for predicting said spectral information based on detected emissions of the first type as an input parameter of said algorithm. With this it is possible to gather EDS data using only a BSE detector.

13 Claims, 5 Drawing Sheets

(52) U.S. Cl.
CPC ... *G01N 2223/053* (2013.01); *G01N 2223/07* (2013.01); *G01N 2223/40* (2013.01); *G01N 2223/507* (2013.01)

(58) Field of Classification Search
CPC ......... G01N 2223/507; G01N 23/2252; G01N 23/04; G01N 23/046; G01N 23/20058; G01N 23/20091; G01N 23/2055; G01N 23/2254; G01N 2223/0566; G01N 2223/079; G01N 2223/08; H01J 37/222; H01J 37/28; H01J 2237/24485; H01J 2237/2817
See application file for complete search history.

(56) References Cited

U.S. PATENT DOCUMENTS

| | | | |
|---|---|---|---|
| 11,120,968 B2 * | 9/2021 | Hujsak | H01J 37/244 |
| 11,373,839 B1 * | 6/2022 | Hlavenka | H01J 37/28 |
| 2014/0032463 A1 * | 1/2014 | Jin | G06N 3/08 706/25 |
| 2016/0123905 A1 | 5/2016 | Liao et al. | |
| 2017/0200290 A1 | 7/2017 | Bhattiprolu et al. | |
| 2020/0034956 A1 * | 1/2020 | Machek | G06V 10/774 |
| 2020/0057011 A1 * | 2/2020 | Tuma | H01J 37/28 |
| 2020/0355633 A1 * | 11/2020 | Klusácek | G01N 23/203 |
| 2020/0393392 A1 * | 12/2020 | Klusácek | G01N 23/2252 |
| 2021/0104375 A1 * | 4/2021 | Geurts | H01J 37/222 |
| 2022/0065804 A1 * | 3/2022 | Kaplenko | G01N 23/2204 |
| 2022/0207893 A1 * | 6/2022 | Kocár | G06V 20/695 |
| 2023/0003675 A1 * | 1/2023 | Kaplenko | G01N 23/2252 |

OTHER PUBLICATIONS

Yuta Yamamoto et al, Twinned/untwinned catalytic gold nanoparticles identified by applying a convolutional neural network to their Hough transformed Z-contrast images, Microscopy, vol. 67, No. 6, Aug. 15, 2018, pp. 321-330.
European Search Report dated Feb. 22, 2021 for priority EP Application No. 20193594.7, filed Aug. 31, 2020.

* cited by examiner

METHOD OF EXAMINING A SAMPLE USING A CHARGED PARTICLE BEAM APPARATUS

FIELD OF THE INVENTION

The invention relates to a method of examining a sample using a charged particle beam apparatus.

BACKGROUND OF THE INVENTION

Charged particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" apparatus (e.g. a FIB-SEM), which additionally employ a "machining" Focused Ion Beam (FIB), allowing supportive activities such as ion-beam milling or Ion-Beam-Induced Deposition (IBID), for example. The skilled person will be familiar with the different species of charged particle microscopy.

Irradiation of a specimen by a scanning electron beam precipitates emanation of "auxiliary" radiation from the specimen, in the form of secondary electrons, backscattered electrons, X-rays and cathodoluminescence (infrared, visible and/or ultraviolet photons). One or more components of this emanating radiation may be detected and used for sample analysis.

Typically in a SEM, backscattered electrons are detected by a solid state detector in which each backscattered electron is amplified as it creates many electron-hole pairs in a semiconductor detector. The backscattered electron detector signal is used to form an image as the beam is scanned, with the brightness of each image point determined by the number of backscattered electrons detected at the corresponding point on the sample as the primary beam moves across the sample. The image merely provides information on the topology of the sample to be examined.

In a process called "energy dispersive x-ray spectroscopy" (also referred to as "EDS" or "EDX"), the energies of x-rays coming from the sample in response to the electron beam are measured and plotted in a histogram to form a material specific spectrum. The measured spectrum can be compared to known spectra of various elements to determine which elements and minerals are present in said sample.

One of the drawbacks of EDS is that it takes considerable time to accumulate an x-ray spectrum for the sample. Typically, a grid with discrete analysis points is used. The electron beam dwells on each analysis point while the EDS detectors record x-rays. Once sufficient x-ray counts are recorded the beam moves to the next analysis point. The signal from the EDS detectors is fed to a signal processing unit that builds an x-ray spectrum curve for each analysis point, which can be matched to an extensive library of known mineral phases to select the best match for that analysis point. This known method is relatively slow for determining the phases, i.e. chemical compositions, that are present in the sample.

In general, acquisition of spectral information of a sample is relatively slow.

With the above in mind, it is an object to provide an improved method of examining a sample using a charged particle beam apparatus, wherein spectral information is used for examining said sample. In particular, it is an object of the present invention to provide a method and apparatus for more rapidly and/or more accurately acquiring spectral information about a sample.

SUMMARY OF THE INVENTION

To this end, the invention provides methods and systems for examining a sample using a charged particle beam apparatus. The method as defined herein comprises the steps of providing a charged particle beam and using said beam for illuminating a sample. The method further comprises the step of detecting, using a first detector, emissions of a first type from the sample in response to the charged particle beam illuminating the sample. Said emissions of a first type relate to non-spectral information. In an embodiment, said first detector is arranged for detecting charged particles, in particular electrons, such as backscattered electrons. The first detector may thus be a BSE detector.

The method as defined herein further comprises the step of predicting spectral information on emissions of a second type from the sample based on the detected emissions of the first type. These emissions of the second type are different from the emissions of the first type. The spectral information may, in an embodiment, be related to x-rays emanating from the sample.

According to the present invention, the step of acquiring said spectral information comprises the steps of providing a spectral information prediction algorithm, and using said algorithm for predicting said spectral information based on detected emissions of the first type as an input parameter of said algorithm.

Thus, as defined herein, the obtained emissions of the first type, such as, for example, backscattered electrons, are used as an input parameter in the spectral information prediction algorithm to obtain the spectral information related to emissions of the second type. Thus, in effect, the spectral information can be obtained or predicted without the need for a second detector for detecting emissions of the second type, and only one detector is, in principle, required for obtaining information on the emissions of the first type and the spectral information.

With this, the object of the invention is achieved. Advantageous embodiments will be described below.

It is noted that multiple detectors of the first type may be used for obtaining said emissions of the first type. Embodiments thereof may include bright field, dark field or high angular annular dark field STEM detectors in TEM. For example.

DETAILED DESCRIPTION

In an embodiment of the method, the charged particle beam is scanned over the specimen. The emissions detected by the first detector, and hence the spectral information determined/predicted with the spectral information prediction algorithm, can be related to a specific scanning beam position, i.e. can be related to a specific position on the sample. This means that spectral information may be determined for corresponding positions on the sample as well. The obtained spectral information for different positions, may be compared to each other, and one or more specific phases can be assigned to these different positions. Already assigned phases can be used to establish an estimated phase for other positions, for example based on proximity to these already assigned phases, based on a partially obtained spectral profile obtained for the other positions, or based on other parameters.

The first detector may be a backscattered electron detector. Backscattering of electrons depends on the atomic number of the elements in the surface and upon the geometric relationship between the surface, the primary beam, and the detector. The backscattered electron image therefore shows contour information, that is, boundaries between regions of different composition, and topographical information. Obtaining a backscattered electron image requires collecting only a sufficient number of electrons at each point to produce a reasonable contrast between points having different properties and so is much faster than obtaining a sufficient number of x-rays to compile a complete spectrum at each point. Also, the probability of an electron being backscattered is greater than the probability of the electron causing the emission of a characteristic x-ray of a particular frequency. Obtaining sufficient backscattered electron image data at a single dwell point typically takes less than a microsecond, whereas acquiring sufficient x-rays to obtain an analyzable spectrum at a single dwell point typically takes more than a millisecond. Thus, by using the relatively fast backscattered electron image as an input to predict spectral information on the sample, it is possible to acquire accurate and fast spectral information of the sample, depending on the accuracy and speed of the spectral information prediction algorithm.

In an embodiment, said algorithm is arranged for identifying interspatial data relationships in said emissions of said first type. The interspatial data relationships may be used to more rapidly and more accurately obtain the spectral information using the spectral information prediction algorithm. In an embodiment, said algorithm is thus arranged for using said identified interspatial data relationships for predicting, at a given sample location, said spectral information.

In an embodiment, said algorithm is arranged for identifying, using emissions of said first type, regions of said sample having similar characteristics. As described above, the backscattered electron image may show contour information, that is, boundaries between regions of different composition, and topographical information. This information can be used by the algorithm for identifying regions having similar characteristics, such as similar composition. In some examples, the input of said algorithm contains only non-spectral information.

In an embodiment, said algorithm comprises at least one trained neural network. The trained neural network may be generated by training a neural network using sample data that comprises information on emissions of the first type and spectral information related to emissions of the second type, wherein these emissions of the first type and second type are physically obtained during data acquisition. With this, the neural network can be trained to predict the spectral information, based on the emissions of the first type as an input parameter. The neural network may be trained based on sample data from a reference sample, or from the same sample of which the spectral information is predicted.

The spectral information may comprise elemental information of said sample. The sample may, in principle, be any sample, although excellent results have been obtained with material samples, such as geological samples and semiconductor samples. Other sample are, however, conceivable as well.

The method may comprise the further step of approving or rejecting said sample based on the acquired spectral information. This is in particular advantageous in process control settings, where a sample can be obtained from a production process, the method as defined herein can be used to collect (predict) spectral information on the sample, and the result may be used to approve or reject the sample, and with this approve or reject the production process or a part thereof. If, for example, a sample contains too much of a certain material, it can be concluded that a specific production process did not yield satisfactory results, and part of the products may then be further investigated.

In an embodiment, the method comprises the further step of outputting data relating to said predicted spectral information, wherein said output comprises at least one of an image of said sample, elemental information of said sample, and/or a verdict on said sample.

According to an aspect, the disclosure provides a charged particle beam apparatus for examining a sample using the method as described above, and comprising:

A charged particle beam source for emitting a charged particle beam;

A sample holder for holding a sample;

An illuminator for directing the charged particle beam emitted from the charged particle beam source onto the sample;

A first detector for detecting emissions of a first type originating from said specimen in response to the illumination of said sample with charged particles emitted from said charged particle source; and A control unit connected to said first detector and arranged for controlling at least part of operations of said charged particle beam apparatus. The control unit may include a processor and a non-transitory memory for storing computer readable instructions.

As defined herein, the charged particle beam apparatus, such as a charged particle microscope, is arranged for executing (e.g. by using the processor) the computer readable instructions stored in the non-transitory memory in order to implement the methods disclosed herein. This means that the control unit may be arranged for using the emissions of the first type in the spectral information prediction algorithm for determining the spectral information of the sample. Alternatively (or additionally) the information of emissions of the first type may be transferred to an external, or cloud-based, processing unit, where the spectral information can be computed. The results can then be transferred back to a relevant user, such as, for example, on a screen located near the charged particle beam apparatus.

When using a cloud-based processing unit, it becomes possible to connect a plurality of charged particle beam apparatuses to a single spectral information prediction algorithm. This allows the determined spectral information to remain accurate and up-to-date to the latest insights and updates of the spectral information prediction algorithm. Updates to the algorithm may be made, and then the charged particle beam apparatuses connected to the external processing unit, such as the cloud-based processing unit, may benefit from this updated algorithm. The data provided by the charged particle beam apparatuses, which may include spectral information, may be used for training purposes, such as for example in case the spectral information prediction algorithm is a neural network. It is conceivable that spectral information is recorded for these charged particle beam apparatuses for calibration purposes, for example whenever a new type of sample is being studied or examined.

In an embodiment, said charged particle beam apparatus comprises at least one detector, including said first detector, wherein every said at least one detector consists of a non-spectral detector. Thus, the charged particle beam apparatus may be free from any spectral detector, and the charged particle beam apparatus may rely solely on the spectral information prediction algorithm for acquiring spectral information on the sample.

According to an aspect, a method of developing an algorithm, in particular a method of training a neural network, is provided, wherein said algorithm is arranged for use in the method as described above. The method of developing the algorithm comprises the following steps:
  Providing sample data on emissions of a first type from a sample;
  Providing corresponding spectral information on emissions of a second type from said sample; and
  Developing said algorithm, in particular training said neural network, with said provided data, wherein emissions of a first type are used as an input, and spectral information is used as a desired output.

The developing method may also be used for updating the spectral information prediction algorithm, in a setting where multiple charged particle beam apparatuses are connected to one or more processing units, such as cloud-based processing units.

In another embodiment, the charged particle beam apparatus further includes a second detector for detecting emissions of a second type from the sample. The provided data for training the neural network may be acquired by the charged particle beam apparatus.

According to another aspect, a non-transitory memory, comprising computer readable instructions that, when executed by a processor, causes a processing unit to:
  Access first detector data corresponding to emissions of a first type from a sample, wherein the emissions of a first type relate to non-spectral information; and
  Generate spectral information of the sample from the first detector data using a spectral information predicting algorithm.

Figure 1:
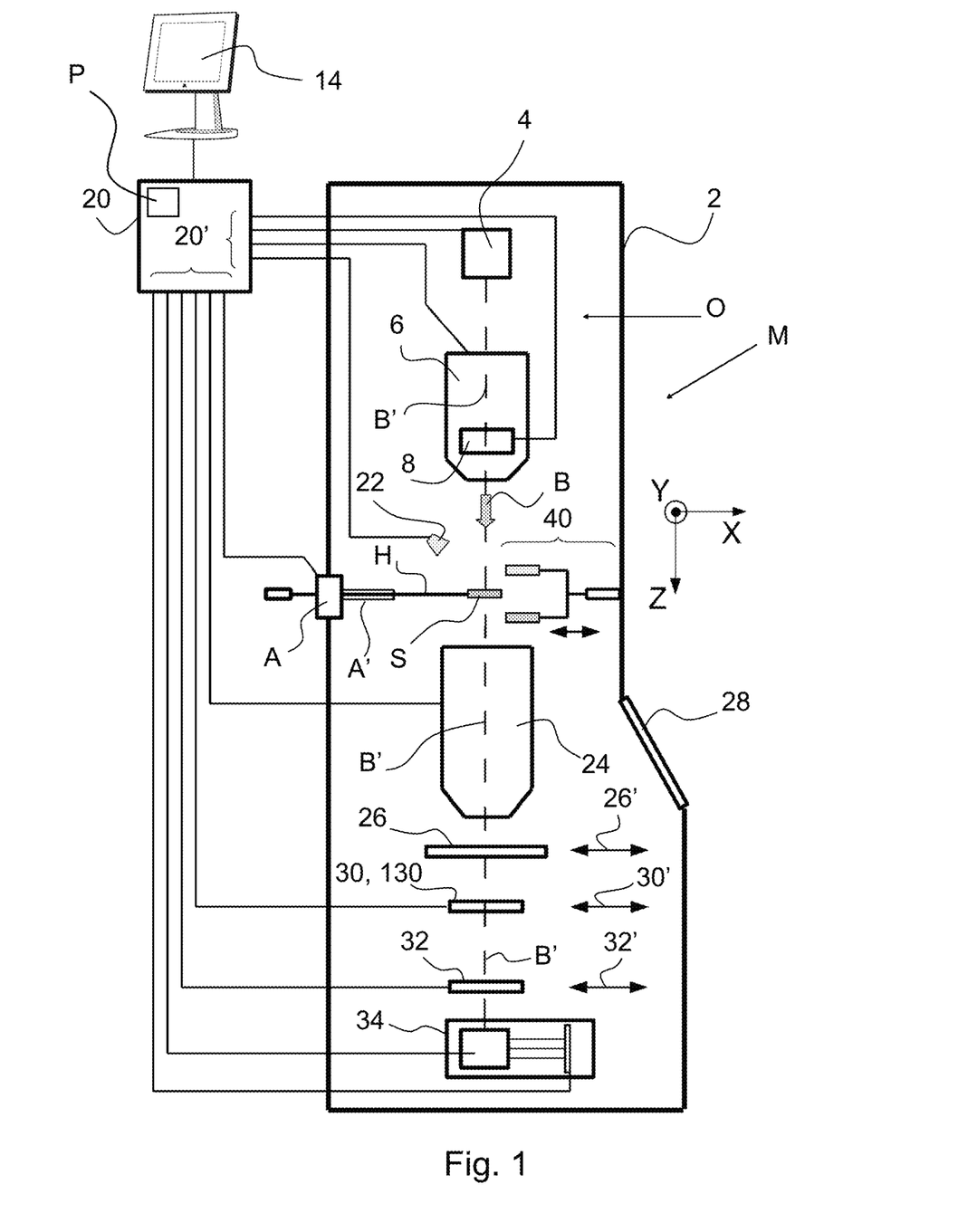
FIG. 1—shows a longitudinal cross-sectional view of a charged particle beam apparatus according to a first embodiment of the invention.

FIG. 1 (not to scale) is a highly schematic depiction of an embodiment of a charged-particle microscope M according to an embodiment of the invention. More specifically, it shows an embodiment of a transmission-type microscope M, which, in this case, is a TEM/STEM (though, in the context of the current invention, it could just as validly be a SEM (see FIG. 2), or an ion-based microscope, for example). In FIG. 1, within a vacuum enclosure 2, an electron source 4 produces a beam B of electrons that propagates along an electron-optical axis B' and traverses an electron-optical illuminator 6, serving to direct/focus the electrons onto a chosen part of a specimen S (which may, for example, be (locally) thinned/planarized). Also depicted is a deflector 8, which (inter alia) can be used to effect scanning motion of the beam B.

The specimen S is held on a specimen holder H that can be positioned in multiple degrees of freedom by a positioning device/stage A, which moves a cradle A' into which holder H is (removably) affixed; for example, the specimen holder H may comprise a finger that can be moved (inter alia) in the XY plane (see the depicted Cartesian coordinate system; typically, motion parallel to Z and tilt about X/Y will also be possible). Such movement allows different parts of the specimen S to be illuminated/imaged/inspected by the electron beam B traveling along axis B' (in the Z direction) (and/or allows scanning motion to be performed, as an alternative to beam scanning). If desired, an optional cooling device (not depicted) can be brought into intimate thermal contact with the specimen holder H, so as to maintain it (and the specimen S thereupon) at cryogenic temperatures, for example.

The electron beam B will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of analysis device 22, which might be a combined scintillator/photomultiplier or EDX or EDS (Energy-Dispersive X-Ray Spectroscopy) module, for instance; in such a case, an image could be constructed using basically the same principle as in a SEM. As defined herein, however, such an EDX or EDS module is, in principle, not actually required for obtaining this spectral information as will be explained later. One can also study electrons that traverse (pass through) the specimen S, exit/emanate from it and continue to propagate (substantially, though generally with some deflection/scattering) along axis B'. Such a transmitted electron flux enters an imaging system (projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B'. An image (or diffractogram) of (part of) the specimen S will be formed by imaging system 24 on screen 26, and this may be viewed through viewing port 28 located in a suitable part of a wall of enclosure 2. The retraction mechanism for screen 26 may, for example, be mechanical and/or electrical in nature, and is not depicted here.

As an alternative to viewing an image on screen 26, one can instead make use of the fact that the depth of focus of the electron flux leaving imaging system 24 is generally quite large (e.g. of the order of 1 meter). Consequently, various other types of analysis apparatus can be used downstream of screen 26, such as:
  TEM camera 30. At camera 30, the electron flux can form a static image (or diffractogram) that can be processed by controller/processor 20 and displayed on a display device 14, such as a flat panel display, for example. When not required, camera 30 can be retracted/withdrawn (as schematically indicated by arrows 30') so as to get it out of the way of axis B'.
  STEM camera 32. An output from camera 32 can be recorded as a function of (X, Y) scanning position of the beam B on the specimen S, and an image can be constructed that is a "map" of output from camera 32 as a function of X, Y. Camera 32 can comprise a single pixel with a diameter of e.g. 20 mm, as opposed to the matrix of pixels characteristically present in camera 30, although camera 32 can be an Electron Microscope Pixel Array Detector (EMPAD) as well. Moreover, camera 32 will generally have a much higher acquisition rate (e.g. $10^6$ points per second) than camera 30 (e.g. $10^2$ images per second). Once again, when not required, camera 32 can be retracted/withdrawn (as schematically indicated by arrows 32') so as to get it out of the way of axis B' (although such retraction would not be a necessity in the case of a donut-shaped annular dark field camera 32, for example; in such a camera, a central hole would allow flux passage when the camera was not in use).

As an alternative to imaging using cameras 30 or 32, one can also invoke spectroscopic apparatus 34, which could be an EELS module, for example.

It should be noted that the order/location of items 30, 32 and 34 is not strict, and many possible variations are conceivable. For example, spectroscopic apparatus 34 can also be integrated into the imaging system 24.

In the embodiment shown, the microscope M further comprises a retractable X-ray Computed Tomography (CT) module, generally indicated by reference 40. In Computed Tomography (also referred to as tomographic imaging) the source and (diametrically opposed) detector are used to look through the specimen along different lines of sight, so as to acquire penetrative observations of the specimen from a variety of perspectives.

Note that the controller (computer processor) 20 is connected to various illustrated components via control lines (buses) 20'. This controller 20 can provide a variety of functions, such as synchronizing actions, providing setpoints, processing signals, performing calculations, and displaying messages/information on a display device (not depicted). Needless to say, the (schematically depicted) controller 20 may be (partially) inside or outside the enclosure 2, and may have a unitary or composite structure, as desired. The controller comprises, as shown in this embodiment, a data processing apparatus P that is arranged for carrying out the method as defined herein.

The skilled artisan will understand that the interior of the enclosure 2 does not have to be kept at a strict vacuum; for example, in a so-called "Environmental TEM/STEM", a background atmosphere of a given gas is deliberately introduced/maintained within the enclosure 2. The skilled artisan will also understand that, in practice, it may be advantageous to confine the volume of enclosure 2 so that, where possible, it essentially hugs the axis B', taking the form of a small tube (e.g. of the order of 1 cm in diameter) through which the employed electron beam passes, but widening out to accommodate structures such as the source 4, specimen holder H, screen 26, camera 30, camera 32, spectroscopic apparatus 34, etc.

Figure 2:
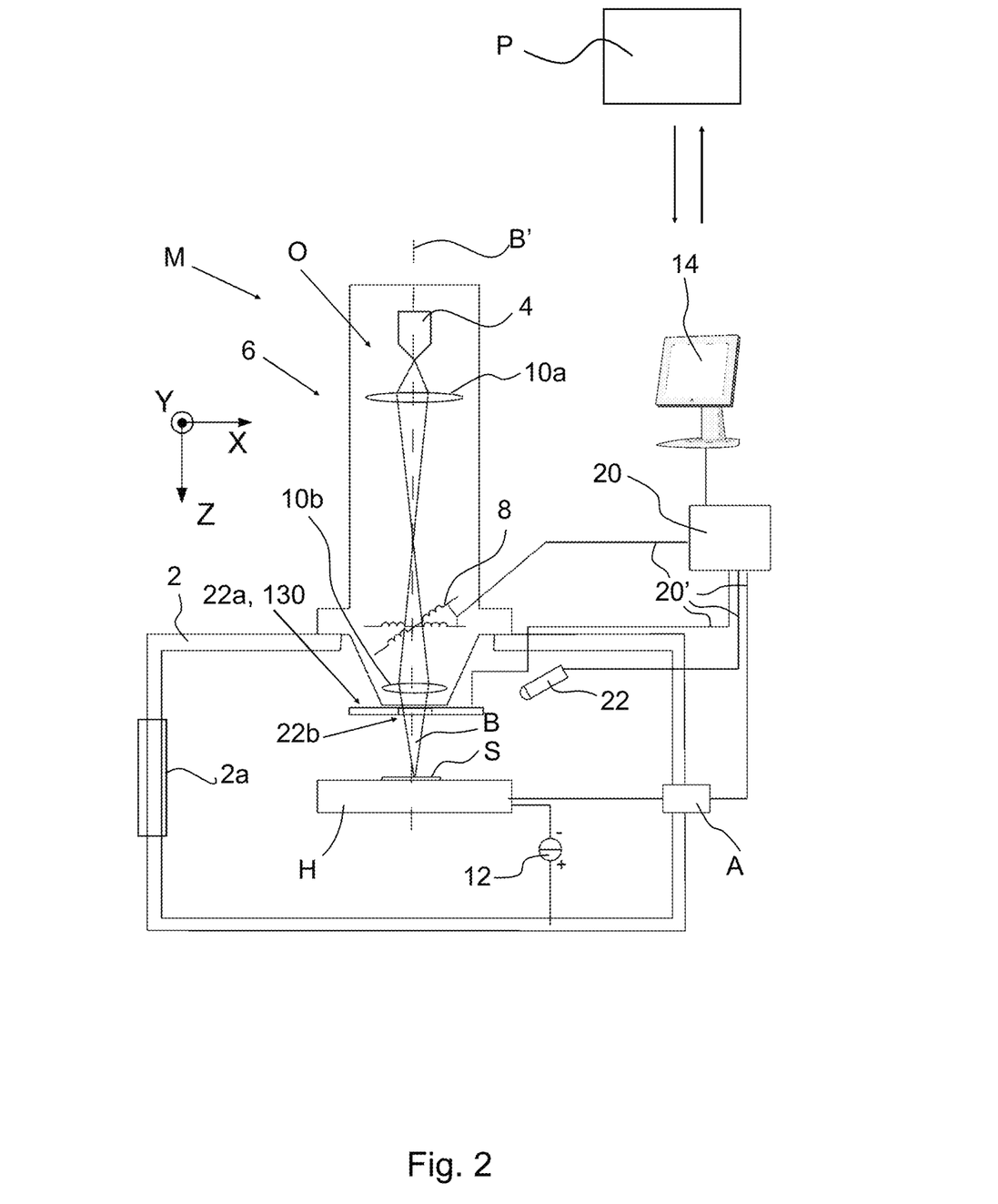
FIG. 2—shows a longitudinal cross-sectional view of a charged particle beam apparatus according to a second embodiment of the invention.

Now referring to FIG. 2, another embodiment of an apparatus according to the invention is shown. FIG. 2 (not to scale) is a highly schematic depiction of a charged-particle microscope M according to the present invention; more specifically, it shows an embodiment of a non-transmission-type microscope M, which, in this case, is a SEM (though, in the context of the current invention, it could just as validly be an ion-based microscope, for example). In the Figure, parts which correspond to items in FIG. 1 are indicated using identical reference symbols, and will not be separately discussed here. Additional to FIG. 1 are (inter alia) the following parts:

2a: A vacuum port, which may be opened so as to introduce/remove items (components, specimens) to/from the interior of vacuum chamber 2, or onto which, for example, an ancillary device/module may be mounted. The microscope M may comprise a plurality of such ports 2a, if desired;

10a, 10b: Schematically depicted lenses/optical elements in illuminator 6;

12: A voltage source, allowing the specimen holder H, or at least the specimen S, to be biased (floated) to an electrical potential with respect to ground, if desired;

14: A display, such as a FPD or CRT;

22a, 22b: A segmented electron detector 22a, comprising a plurality of independent detection segments (e.g. quadrants) disposed about a central aperture 22b (allowing passage of the beam B). Such a detector can, for example, be used to investigate (the angular dependence of) a flux of output (secondary or backscattered) electrons emerging from the specimen S.

Here also, a controller 20 is present. The controller is connected to the display 14, and the display 14 may be connectable to a data processing apparatus P that is arranged for carrying out the method as defined herein. In the embodiment shown, the data processing apparatus P is a separate structure that does not form part of the controller, and does not even form part of the microscope P. The data processing apparatus P may be local or cloud-based, and is in principle not limited to any location. It is noted that in all embodiments described herein, the data processing unit P can be part of the charged particle beam apparatus, such as the charged particle microscope, or can be placed externally.

Figure 3:
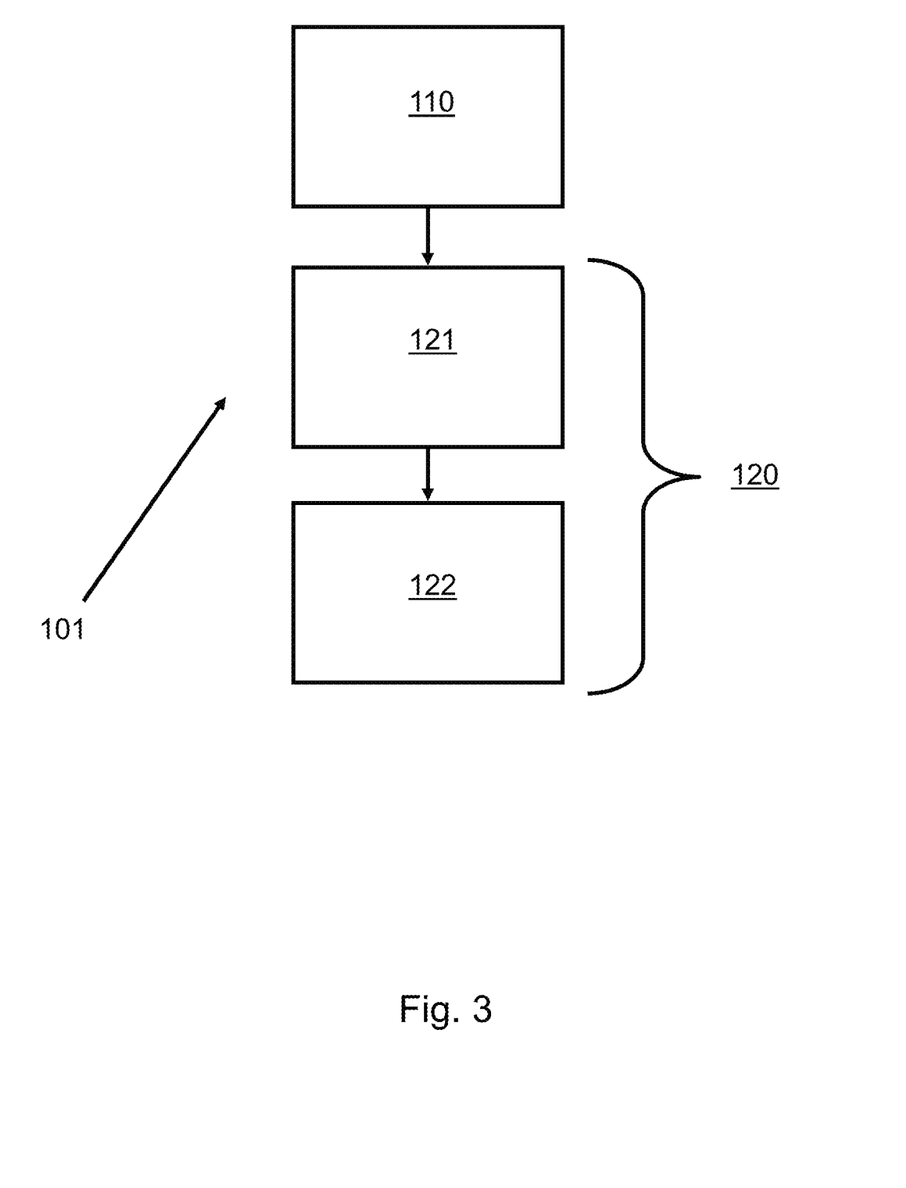
FIG. 3—shows a schematic overview of an neural network architecture that can be used as a spectral information prediction algorithm.

Now turning to FIG. 3, an embodiment of the method as defined herein is schematically shown. The method 101 is used for examining a sample using a charged particle beam apparatus, and comprising the steps of:

Detecting 110, using a first detector, emissions of a first type from the sample in response to the charged particle beam illuminating the sample; and Acquiring 120 spectral information on emissions of a second type from the sample in response to the charged particle beam illuminating the sample.

As indicated before, prior art methods have used two detectors, such as a backscattered electron detector for detecting emissions of the first type in the form of backscattered electrons, and an EDS detector for detecting emissions of the second type in the form of x-rays. However, the method as defined herein does not require the use of a spectral detector, in principle, although such a detector could be present of course. To this end, the method as defined herein uses the following steps to acquire 104 spectral information. The first step is to provide 102 a spectral information prediction algorithm, and the second step is to use 103 said algorithm for predicting said spectral information. The spectral information prediction algorithm uses the detected emissions of the first type as an input parameter of said algorithm. Hence, the spectral information prediction algorithm is arranged for predicting the spectral information based on the detected emissions of the first type, in the form of, for example, backscattered electrons. In an embodiment, the spectral information thus relates to EDS information that is predicted based on detected backscattered electrons.

Figure 4A:
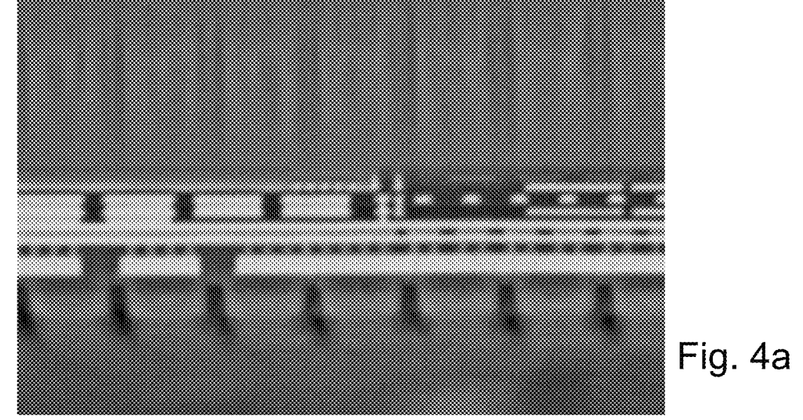
FIG. 4a-c—show, respectively, a) an electron microscope image, b) an EDS image obtained with an EDS detector, and c) a predicated EDS image obtained with an spectral information prediction algorithm as defined herein.
Figure 4B:
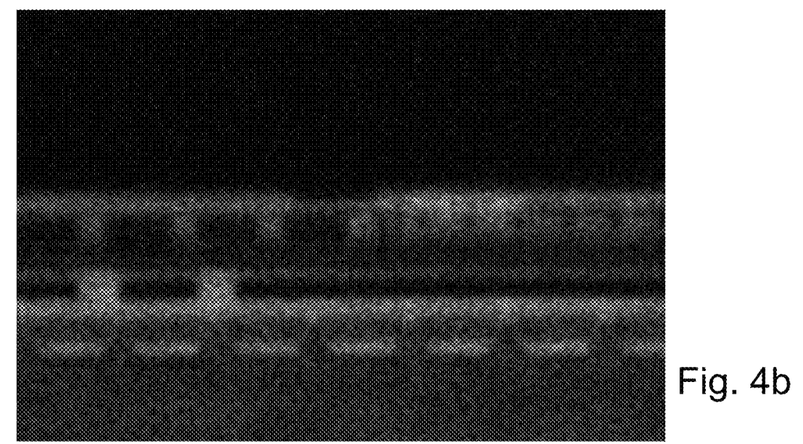
Figure 4C:
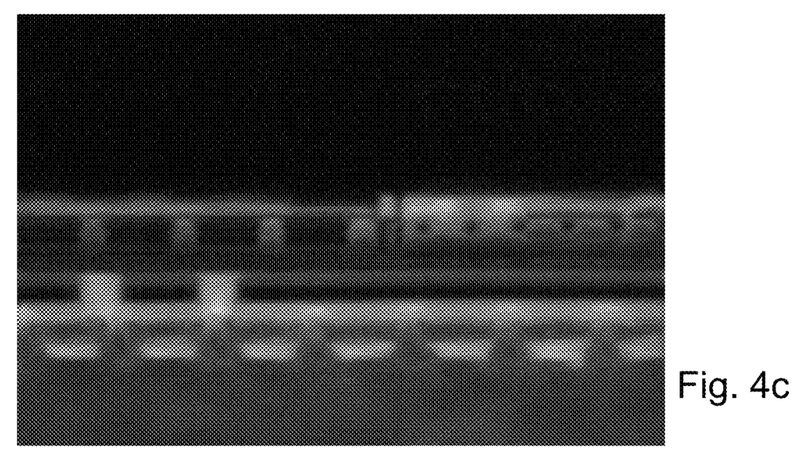

Now turning to FIG. 4a-4c, an example of the results achievable with the spectral information prediction algorithm is shown. FIG. 4a shows an backscattered electron image of a semiconductor sample. Here, the construction and layout of a chip are recognizable for those skilled in the art. FIG. 4b shows the EDS image of the sample shown in FIG. 4a, wherein use is made of an EDS detector. It can be seen that the data is relatively noisy in a lot of places, which makes it hard to correctly and confidently identify materials in some regions. FIG. 4c shows a predicated EDS image of the sample shown in FIG. 4a, wherein use is made of the spectral information prediction algorithm as defined herein. Here, it can be seen that the signal to noise ratio is improved with respect to the measured EDS data.

The algorithm that is used in the prediction of spectral data may be arranged for identifying interspatial data relationships in said emissions of said first type. In the example shown in FIG. 4c, the algorithm is able to identify certain regions in the EM image (FIG. 4a), wherein said regions have a common characteristic, and based on that the algorithm is able to more rapidly and/or more accurately identify those regions as having the same or similar spectral data (which may relate to similar composition). Thus, the algorithm may be arranged for using said identified interspatial data relationships for predicting, at a given sample location, said spectral information.

In one embodiment, the algorithm comprises at least one neural network. As known to those skilled in the art, a neural network (NN)—also referred to as artificial neural network (ANN) or simulated neural network (SNN)—is an interconnected group of artificial neurons that uses a mathematical or computational model for information processing based on a connectionistic approach to computation. The artificial neural network as defined herein is an adaptive system that changes its structure based on external or internal information that flows through the network. In more practical terms neural networks are non-linear statistical data modelling or decision making tools that can be used to model complex relationships between inputs and outputs or to find patterns in data. Learning in neural networks is particularly useful in applications where the complexity of the data or task makes the design of such functions by hand impractical. Thus, the application of a neural network is advantageous for optimizing the alignment procedure in any charged particle beam apparatus. In the present disclosure, the neural network can be trained on sample data that involves data related to emissions of the first type (e.g. backscattered electron images) as an input parameter, and involves data related to emissions of the second type (spectral data, e.g. EDS data) as a desired output parameter. This data is easily obtainable and can thus be used in a quick and reliable manner for training purposes. Hence, the spectral information prediction algorithm may be developed by the steps of:

Providing sample data on emissions of a first type from a sample, in particular wherein said emissions of a first type relate to non-spectral data;

Providing corresponding spectral information on emissions of a second type from said sample, in particular wherein said spectral information relates to measured spectral information; and Developing said algorithm, in particular training said neural network, with said provided data, wherein emissions of a first type are used as an input, and spectral information is used as a desired output.

Figure 5:
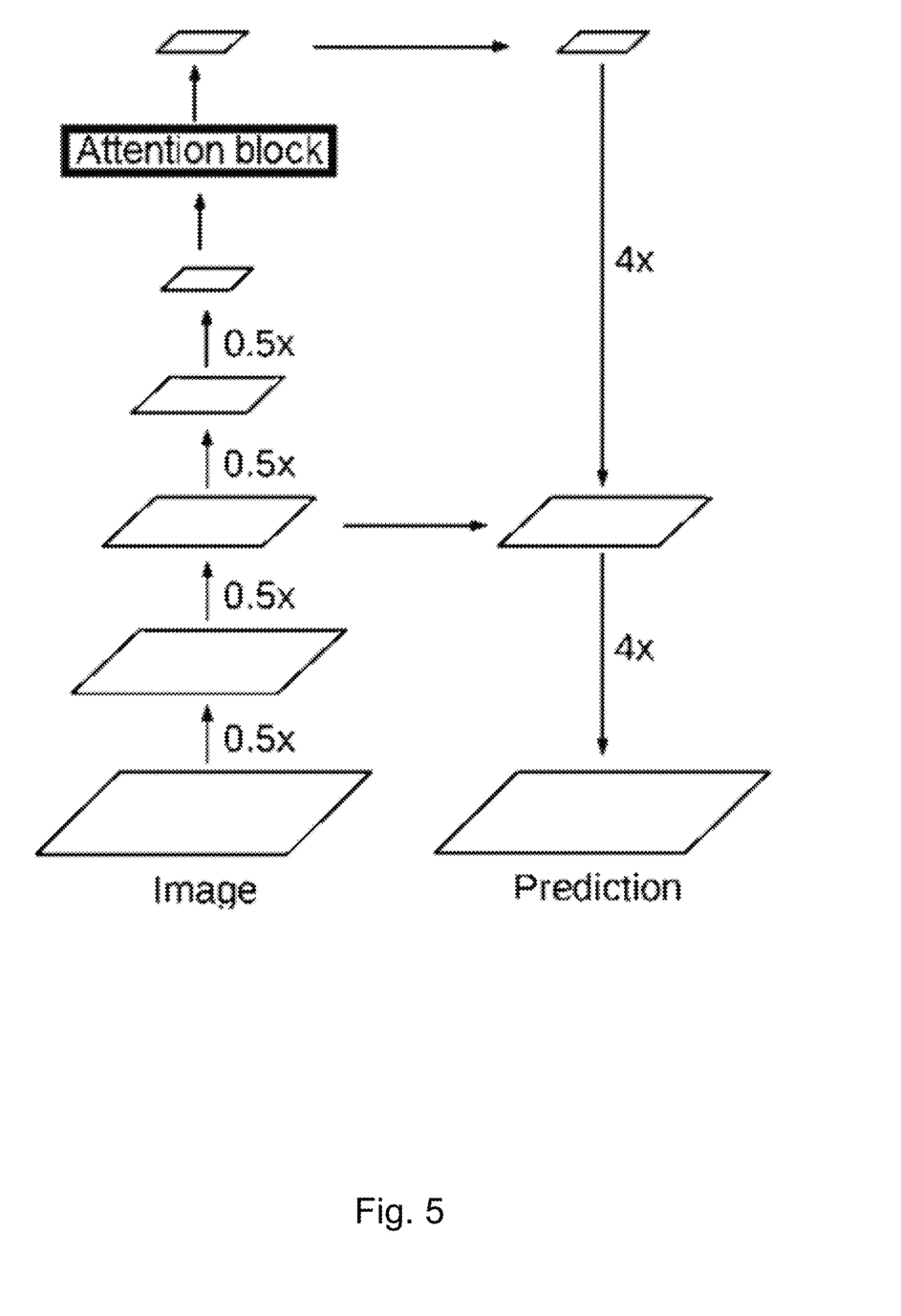
FIG. 5—shows an example of a neural network architecture that can be used in the spectral information prediction algorithm as defined herein.

FIG. 5 shows an example of a neural network architecture that can be used in the spectral information prediction algorithm as defined herein. Said neural network takes advantage of convolution layers, attention block concept and auto encoder-decoder architecture. MobileNet V2 architecture was used as neural network backbone and the depth wise separable convolution layers were added, resulting in a faster and stronger encoder-decoder network. An attention augmented convolutional block that better captures pixel-wise relationships in the whole image was added at the bottleneck part of encoder-decoder architecture. The key idea behind self-attention is to produce a weighted average of values computed from hidden units. The weights used in the weighted average operation are produced dynamically via a similarity function between hidden units. In particular, this allows self-attention to capture long range interactions.

The task at hand was, in an embodiment, posed as semantic segmentation problem with the goal to assign semantic labels to every pixel in an image. Said algorithm differs from classical semantic segmentation in a way that multiple labels can be assigned to each pixel (multiple chemical elements can be present at the same pixel location) and pixel intensities of predicted analytical maps (neural network output) has varying values providing quantitative results (atomic percentages of defined chemical elements).

The method as defined herein is in particular useful in cases where samples need to be examined that do not show a lot of variability. In quality control processes for example, where the examination can lead to approval or rejection of the sample or the process, or in cases where a single type of sample is being studied. Examples may include semiconductor samples and mineralogy samples. However, it is conceivable that training of the spectral information prediction algorithm is possible for samples having a large variety as well.

The charged particle beam apparatuses as shown in FIG. 1 and FIG. 2 may be arranged for executing the method as defined herein. The controller, for example, may be arranged for using the spectral information prediction algorithm to predict the spectral information based on detected emissions of a first type, wherein said detected emissions of a first type relate to non-spectral information, such as backscattered electrons. Spectral detectors may be included, and may be used as an input parameter, for example, to the spectral information prediction algorithm, although this is not required by the present disclosure. Hence, the detectors available in the charged particle beam apparatuses may all relate to non-spectral detectors.

The desired protection is conferred by the appended claims.

The invention claimed is:

1. A method of examining a sample using a charged particle beam apparatus, comprising:
   Detecting, using a first detector, emissions of a first type from the sample in response to the charged particle beam illuminating the sample; and
   Predicting spectral information on emissions of a second type from the sample using at least one trained neural network, wherein the detected emissions of the first type is an input of the trained neural network, and wherein the trained neural network is generated by training a neural network with sample data on emissions of the first type and spectral information on emissions of the second type from the sample or a reference sample, wherein the emissions of the first type are used as an input of the neural network, and the corresponding spectral information is used as a desired output of the neural network.

2. Method according to claim 1, wherein predicting spectral information on emissions of a second type from the sample using at least one trained neural network includes using the trained neural network to identify interspatial data relationships in said emissions of said first type, and use said identified interspatial data relationships for the predicting, at a given sample location, said spectral information.

3. Method according to claim 1, wherein the interspatial data relationships includes regions of said sample having similar characteristics.

4. Method according to claim 1, wherein said sample is a semiconductor sample.

5. Method according to claim 1, wherein said spectral information comprises elemental information of said sample.

6. Method according to claim 1, further comprising approving or rejecting said sample obtained from a production process based on the acquired spectral information.

7. Method according to claim 1, further comprising outputting data relating to said predicted spectral information, wherein said outputting data comprises at least one of an image of said sample, elemental information of said sample, and/or a verdict on said sample.

8. Method according to claim 1, wherein the input of the trained neural network does not include data relating to spectral information of the sample.

9. Method according to claim 1, wherein emissions of the first type are backscattered electrons, and emissions of the second type are X-rays.

10. A charged particle beam apparatus for examining a sample, comprising:
   A charged particle beam source for emitting a charged particle beam;
   A sample holder for holding a sample;
   An illuminator for directing the charged particle beam emitted from the charged particle beam source onto the sample;
   A first detector for detecting emissions of a first type originating from said sample in response to the illumination of said sample with charged particles emitted from said charged particle source; and
   A control unit including a processor and a non-transitory memory for storing computer readable instructions, by executing the instructions by the processor, the control unit is configured to control the charged particle beam apparatus to:
   Illuminate the sample with the charged particle beam;
   Detect emissions of the first type from the sample in response to the illumination; and
   Determine spectral information on emissions of a second type from the sample using a trained neural network, wherein the detected emissions of the first type is an input of said trained neural network, wherein the trained neural network is generated by training a neural network with emissions of the first type and emissions of a second type from the sample or a reference sample, wherein emissions of the first type includes no spectral information and the emissions of the second type includes spectral information.

11. The charged particle beam apparatus according to claim 10, wherein said first detector is a non-spectral detector.

12. The charged particle beam apparatus according to claim 10, further comprising a second detector for detecting emissions of the second type, and the control unit is further configured to control the charged particle beam apparatus to:
   Illuminate the sample or the reference sample with the charged particle beam; and
   Detect the emissions of the first type and the emissions of the type from the sample or the reference sample using both the first detector and the second detector.

13. A non-transitory memory, comprising computer readable instructions that, when executed by a processor, causes a processing unit to:
   Access first detector data corresponding to emissions of a first type from a sample, wherein the emissions of a first type relate to non-spectral information; and
   Generate spectral information of the sample from the first detector data using a trained neural network, wherein the trained neural network is generated by training a neural network with emissions of the first type and emissions of a second type from the sample or a reference sample, wherein emissions of the first type include no spectral information and the emissions of the second type includes spectral information, wherein the spectral information includes elemental information.

* * * * *